(12) United States Patent
Ketola et al.

(10) Patent No.: US 8,796,532 B2
(45) Date of Patent: Aug. 5, 2014

(54) METHODS FOR FABRICATING PHOTOVOLTAIC MODULES BY TUNING THE OPTICAL PROPERTIES OF INDIVIDUAL COMPONENTS

(75) Inventors: Barry Ketola, Freeland, MI (US); Ann Norris, Midland, MI (US); Nick Powell, Essexville, MI (US); Keith McIntosh, Coledale (AU); James Cotsell, Narrabundah (AU)

(73) Assignees: Dow Corning Corporation, Midland, MI (US); The Australian National University (AU)

( * ) Notice: Subject to any disclaimer, the term of this patent is extended or adjusted under 35 U.S.C. 154(b) by 86 days.

(21) Appl. No.: 13/376,015

(22) PCT Filed: Jun. 3, 2010

(86) PCT No.: PCT/US2010/037228
§ 371 (c)(1),
(2), (4) Date: Dec. 2, 2011

(87) PCT Pub. No.: WO2010/141697
PCT Pub. Date: Dec. 9, 2010

(65) Prior Publication Data
US 2012/0073654 A1 Mar. 29, 2012

Related U.S. Application Data

(60) Provisional application No. 61/184,569, filed on Jun. 5, 2009.

(51) Int. Cl.
*H01L 31/0203* (2014.01)
*H01L 31/052* (2014.01)
*B32B 17/10* (2006.01)
*H01L 31/048* (2014.01)

(52) U.S. Cl.
CPC .......... *H01L 31/048* (2013.01); *H01L 31/0527* (2013.01); *B32B 17/10798* (2013.01); *B32B 17/10018* (2013.01); *Y02E 10/52* (2013.01); *H01L 31/0522* (2013.01)
USPC .............................. 136/201; 136/251; 438/64

(58) Field of Classification Search
USPC ......... 136/201, 206, 244, 251, 252, 258, 261; 438/64
See application file for complete search history.

(56) References Cited

U.S. PATENT DOCUMENTS

2006/0283495 A1* 12/2006 Gibson .................. 136/244
2008/0276983 A1 11/2008 Drake et al.

(Continued)

FOREIGN PATENT DOCUMENTS

| FR | 2 917 899 | 12/2008 |
| JP | 2005353836 A * | 12/2005 |
| WO | WO 2009/042184 | 4/2009 |

OTHER PUBLICATIONS

JP2005353836A, Dec. 2005 Fujii et al. English Equivalent of Abstract.*

(Continued)

Primary Examiner — Susan D Leong
(74) Attorney, Agent, or Firm — Brinks Gilson & Lione (57) ABSTRACT

Methods for fabricating a photovoltaic module, and the resulting photovoltaic module, are provided and include selecting a photovoltaic cell operable to convert photons to electrons, selecting a light transparent superstrate material having a superstrate absorption coefficient and a superstrate refractive index, and selecting an encapsulant having an encapsulant absorption coefficient and an encapsulant refractive index, wherein an absorption coefficient relationship between the superstrate absorption coefficient and the encapsulant absorption coefficient and a refractive index relationship between the superstrate refractive index and the encapsulant refractive index are selected such that there is a gain in efficiency, and assembling the photovoltaic module using the selected materials.

6 Claims, 11 Drawing Sheets

(56) References Cited

U.S. PATENT DOCUMENTS

2008/0302357 A1* 12/2008 DeNault ................. 126/704
2010/0186801 A1* 7/2010 Boehm et al. ............ 136/254
2010/0285241 A1* 11/2010 Park ...................... 427/596

OTHER PUBLICATIONS

International Search Report of PCT/US2010/037228, Mailed May 24, 2011, 4 pages.

* cited by examiner

METHODS FOR FABRICATING PHOTOVOLTAIC MODULES BY TUNING THE OPTICAL PROPERTIES OF INDIVIDUAL COMPONENTS

CROSS REFERENCE TO RELATED APPLICATIONS

This application is a §371 national stage application of International Application No. PCT/US2010/037228 filed on Jun. 3, 2010, which claims priority to U.S. Provisional Application No. 61/184,569 filed on Jun. 5, 2009, the entire contents of which are hereby incorporated by reference.

FIELD

This disclosure relates generally to photovoltaic modules. More specifically, this disclosure relates to photovoltaic modules having a controlled retractive index mismatch or enhanced efficiency, as well as a method of fabricating said modules.

BACKGROUND

A typical photovoltaic module or solar cell comprises a plurality of individual components to harness solar energy while providing a durable and stable construction. For example, a photovoltaic module may comprise a backsheet, a bottom layer of encapsulant, a photovoltaic cell, a layer of encapsulant over the cell, and a transparent, rigid cover. The components are sandwiched together so light can pass through the upper layers of the module and impinge upon the cell. The cell converts the incident photons to electrons to harness the energy of the incident light. However, the overall efficiency of photovoltaic modules depends at least in part on the amount of incident light reaching the photovoltaic cells. Light may be absorbed, reflected or refracted by the plurality of components and interfaces in the module, thereby limiting the amount of incident light reaching the cell.

While each individual component serves a specific role, the encapsulant may be of particular importance to the cell's efficiency due to its many requirements. It must be optically transparent, electrically insulating, mechanically compliant, adherent to both glass and photovoltaic cells, and sufficiently robust to withstand an extended life in the field. There have already been various attempts to overcome disadvantages inherent in using different materials for the encapsulant. For example, traditional cells have often used ethylene vinyl acetate (EVA) copolymers as the encapsulant material. However, EVA is not stable when exposed to UV radiation. To improve long term stability, typically UV absorbers must be added, which results in the encapsulant having low light transmission in the UV range of the spectrum. It has been proposed to replace EVA with silicones as the encapsulant because silicones are stable over a wide range of temperatures, have desirable dielectric properties, and possess optical transparency.

However, there remains a need in the art to continue to improve upon the efficiency of photovoltaic modules and arrays.

SUMMARY

In one embodiment, a method for fabricating a photovoltaic module having a gain in efficiency is provided. The method includes selecting a photovoltaic cell operable to convert photons to electrons, selecting a light transparent superstrate having a superstrate absorption coefficient and a superstrate refractive index, and selecting an encapsulant having an encapsulant absorption coefficient and an encapsulant refractive index, wherein the absorption coefficients of the superstrate and the encapsulant are selected to optimize light passage into the module, such as, for example, wherein the respective absorption coefficients are desirably as low as possible. The respective refractive indices of the superstrate and the encapsulant are selected such that there is a gain in efficiency. The photovoltaic module is assembled using the selected components.

In another embodiment, a method for fabricating a photovoltaic module with tuned optical properties is provided. The method includes providing encapsulant optical properties for a plurality of encapsulant materials, comparing the efficiency of photovoltaic modules implementing each of the plurality of encapsulant materials, and selecting one of the plurality of encapsulant materials for use in fabricating the photovoltaic module based on comparing the efficiency of photovoltaic modules implementing each of the plurality of encapsulant materials, and assembling the photovoltaic module using the selected encapsulant materials.

In yet another embodiment, a photovoltaic module with controlled refractive index mismatch is provided. The photovoltaic module includes a photovoltaic cell operable to convert photons to electrons, a light transparent superstrate, and a silicone encapsulant separating the superstrate from the photovoltaic cell, wherein the silicone encapsulant has a refractive index greater than the refractive index of the superstrate.

In yet another embodiment, a photovoltaic module having an improved efficiency is provided. The photovoltaic module includes a photovoltaic cell operable to convert photons to electrons, a light transparent superstrate, and an encapsulant separating the superstrate from the photovoltaic cell, wherein the encapsulant has a refractive index and an absorption coefficient such that the reduction in optical loss of the module achieved through an increase in internal reflection as dictated by escape cone losses, is more than the optical loss associated with reflections at the encapsulant superstrate interface.

These and additional features provided by the embodiments described herein will be more fully understood in view of the following detailed description, in conjunction with the accompanying drawings.

BRIEF DESCRIPTION OF THE DRAWINGS

A more complete appreciation of the invention and the several embodiments thereof may be readily obtained as the same becomes better understood by reference to the following detailed description when considered in connection with the accompanying drawings, wherein.

DETAILED DESCRIPTION

Features and advantages of the invention will now be described with occasional reference to specific embodiments. However, the invention may be embodied in different forms and should not be construed as limited to the embodiments set forth herein. Rather, these embodiments are provided so that this disclosure will be thorough and complete and will fully convey the scope of the invention to those skilled in the art.

Unless otherwise defined, all technical and scientific terms used herein have the same meaning as commonly understood by one of ordinary skill in the art to which the invention pertains. The terminology used in the description herein is for describing particular embodiments only and is not intended to be limiting.

As used in the specification and appended claims, the singular forms "a," "an," and "the" are intended to include the plural forms as well, unless the context clearly indicates otherwise.

Unless otherwise indicated, the numerical properties set forth in the specification and claims are approximations that may vary depending on the desired properties sought to be obtained in embodiments of the present invention. Notwithstanding that the numerical ranges and parameters setting forth the broad scope of the invention are approximations, the numerical values set forth in the specific examples are reported as precisely as possible. Any numerical values, however, inherently contain certain errors necessarily resulting from error found in their respective measurements.

According to embodiments, provided is a method for tuning the selection of materials of individual components of a photovoltaic module based on their refractive index (n), absorption coefficient (α) and/or other optical properties through optical modeling, such as, for example, ray-trace modeling, to increase the overall efficiency of the photovoltaic module.

Figure 1:
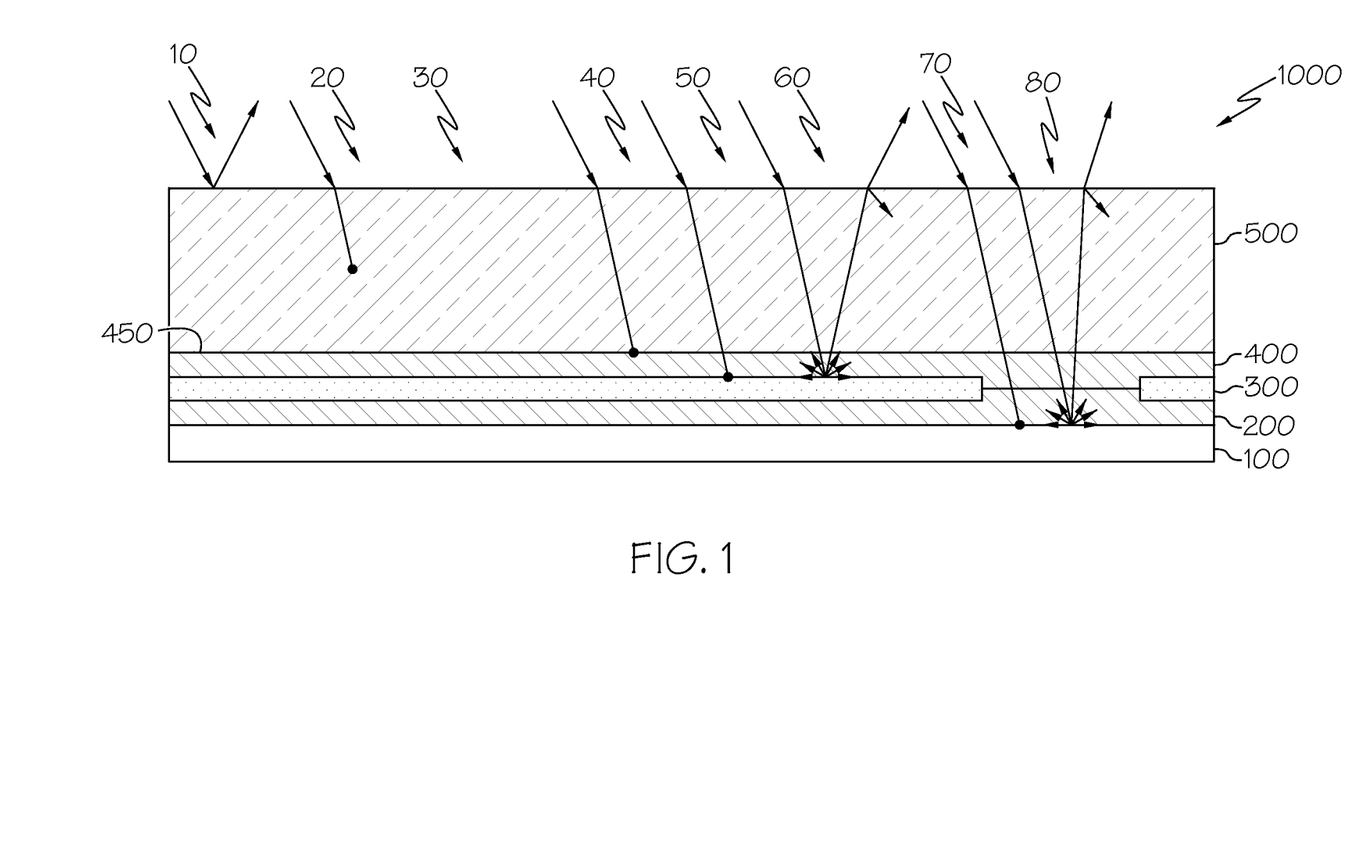
FIG. 1 is a cross-sectional diagram of an exemplary photovoltaic module depicting optical loss mechanisms with respect to various individual components.

Referring to FIG. 1, a photovoltaic module 1000 may comprise a plurality of individual components including, but not limited to, a backsheet 100, a bottom layer of encapsulant 200, a photovoltaic cell 300, a top layer of encapsulant 400 and light transparent superstrate 500. The backsheet 100 may comprise any material operable to provide mechanical strength to the photovoltaic module and limit the infiltration of outside elements (such as water, dust, and other contaminants) from entering the photovoltaic module 1000. For example, the backsheet 100 may comprise a fluoropolymer such as polyvinyl fluoride (PVF), also known as Tedlar® film utilized by numerous backsheet manufacturers. In addition to providing strength and protection to the photovoltaic module 1000, the backsheet may also serve to absorb or reflect incident light as will become appreciated later herein. For example, a backsheet having a textured surface may diffusely scatter incident light as opposed to a more mirrored reflection from a more planar surface. Accordingly, the selection of materials to comprise the backsheet may depend on both its mechanical as well as optical properties.

Referring still to FIG. 1, the photovoltaic module may further comprise a photovoltaic cell 300. The cell 300 may be protected by a top layer of encapsulant 400 and a bottom layer of encapsulant 200 and placed on top of the backsheet 100. The cell 300 itself may comprise any photovoltaic material operable to convert incident photons to electrons. The cell may further comprise any crystal structure, such as monocrystalline or multi-crystalline (or polycrystalline), or surface, such as planar or textured. For example, the cell 300 may comprise planar multi-crystalline silicon, textured monocrystalline silicon or any variations thereof. Additionally, the cell 300 may have electrical contacts operable to transmit the converted electrons away from the cell. For example, the contacts may comprise any conducting material operable of carrying a current such as a metal or alloy having high conductivity and low resistance such as silver (Ag). In one embodiment, the cell 300 may comprise a screen-printed cell wherein contacts are disposed on the top side of the cell 300 (or the side facing the top layer of encapsulant 400). In another embodiment, the cell 300 may comprise a rear contact cell wherein the contacts are disposed on the bottom side of the cell 300 (or the side facing the bottom layer of encapsulant 200), such as those produced by SunPower Corporation following the procedure set forth in W. P. Mulligan, et al., *Proc. 19th EU PVSEC*, Paris, pp. 387-90, 2004.

In one embodiment, a photovoltaic module may comprise a plurality of cells 300 positioned adjacent to one another. The cells 300 may comprise any individual dimension operable to provide for the conversion of photons to electrons and enable packing within a photovoltaic module 1000. For example, each of the plurality of cells 300 may comprise a dimension in the range of about 200 mm by 200 mm providing uniform dimensions amongst the cells. Or, individual cell dimensions may vary to enable customized packing around possible obstructions about the photovoltaic module 1000 or to conform with customized or unique construction requirements. While the positioning of the cells 300 may influence the overall amount of available area for cells 300 (which may in turn influence the overall efficiency of the photovoltaic module) it should be appreciated that embodiments may comprise cells of any dimension or in any packing configuration such that they are covered by a top layer of encapsulant 400 and superstrate 500 and operable to receive incident photons for the conversion to electrons as appreciated herein.

The encapsulant 200, 400 may surround and protect the cell 300 from the backsheet 100 and the superstrate 500. The encapsulant 200, 400 may comprise a bottom layer of encapsulant separating the cell 300 from the backsheet 100 and a top layer of encapsulant separating the cell 300 from the superstrate 500. In the alternative, the encapsulant 200, 400 may comprise one continuous encapsulant wherein the top and bottom layers connect at gaps between individual cells 300. The bottom layer of encapsulant 200 and top layer of encapsulant 400 may comprise any material operable to both protect the cell 300, and allow for the transmittance of incident photons to the surface of the cell 300, such as a gel, elastomer or resin. Furthermore, where the top layer of encapsulant 400 and the bottom layer of encapsulant 200 are separate layers, they may either comprise the same material or different materials. In one embodiment, the encapsulant 200, 400 may comprise an optically transparent silicone material. In another embodiment, the top layer of encapsulant 400 may comprise an optically transparent silicone material and the bottom layer of encapsulant 200 may comprise an ethylene vinyl acetate (EVA) copolymer. In yet another embodiment, a thin layer of encapsulant may coat the cells and backsheet to provide a high refractive index as will become appreciated later herein and a second bulkier layer of encapsulant may be provided to ensure a low absorption coefficient as also will become appreciated later herein.

Superstrate 500 may comprise any material operable to protect the other surface of the photovoltaic module 1000 and allow for the transmission of incident photons through its layer. Typically, superstrate 500 will comprise a glass. For example, where the cut-off wavelength of glass (or the range of wavelengths that cannot pass through the glass) depends on its levels of cerium and iron, a glass may be selected having low cerium and iron contents. For example, the glass may comprise low-iron Starphire® glass from PPG which possesses a cut-off wavelength of 330 nm.

Additional features, structures or additives may also be present on, about or throughout the photovoltaic module 1000. For example, an antireflection coating (ARC), also referred to as an anti-reflective coating, may be applied to any of the surfaces of the photovoltaic module to limit the amount of incident light lost to reflection as will become appreciated herein. ARCs may comprise single layer coatings, multilayer coatings or any other variation operable to limit or reduce the amount of reflection of incident light from a coated surface.

Each of the encapsulant, superstrate and other components of the photovoltaic module have various optical properties such as a refractive index (n) and an absorption coefficient ($\alpha$). The refractive index is wavelength dependent and correlates with the amount of bending or refracting incident light undertakes upon entering the material. The absorption coefficient, also wavelength dependent, can be used to measure the intensity of light passing through a layer of material in accordance with the Beer-Lambert law presented below, where I is the measured light intensity transmitted through a layer, $I_o$ is the incident intensity, $\alpha$ is the absorption coefficient (also referred to as the attenuation coefficient), and x is the path length or thickness:

$I = I_o e^{-\alpha x}$ equation should be $I = I0e - ax$

These optical properties and the overall structure of the photovoltaic module 1000 may influence the various paths of incident light as it travels throughout the photovoltaic module, which in turn may influence the amount of photons reaching the cell 300 and the overall efficiency of the photovoltaic module. For example, where two adjacent materials possess different refractive indices, incident light will be partially reflected and may be lost from the photovoltaic module.

Referring still to FIG. 1, eight different incident light paths are shown with respect to an exemplary photovoltaic module 1000. The first path 10 illustrates reflection of incident light off of the air-superstrate interface. Such reflection may result from the reflective properties of the superstrate or as a result of the difference in refractive indices between the two media. The second path 20 illustrates absorption by superstrate 500 which may depend on the structure and composition of the superstrate. The third path 30 illustrates reflection from the superstrate-encapsulant interface 450 at least partially as a result of differences between the refractive indices of each medium. Also as shown, at least some portion of the light reflected from interface 450 may be reflected back internally into the module at the air-superstrate interface. The fourth path 40 illustrates absorption by the encapsulant itself. The fifth path 50 illustrates absorption by materials surrounding the cell such as an antireflection coating or metal contacts (such as in a screen-printed cell). The sixth path 60 illustrates reflection that may occur at the interface between the encapsulant and the cell. As also shown, at least some portion of the light reflected from that interface may be reflected back internally into the module at the air-superstrate interface. The seventh path 70 illustrates the absorption of photons by the backsheet 100. Finally, the eighth path 80 illustrates reflection from the interface between the encapsulant and the backsheet. Again, as also shown, at least some portion of the light reflected from that interface may be reflected back internally into the module at the air-superstrate interface.

Other potential paths for the incident light also exist within a photovoltaic module 1000 and the eight illustrated paths are intended to be exemplary and non-limiting illustrations. For example, where light is reflected internally within the photovoltaic module (such as at the superstrate-encapsulant interface 450 or off of the backsheet 100), the light may be reflected towards the cell 300 or otherwise reflected, refracted or absorbed within the photovoltaic module 1000. The overall total light to escape the photovoltaic module may be referred to as the escape loss or escape cone loss and may depend on the optical and structural properties of each component within the photovoltaic module 1000. For example, where internal components diffusely reflect or scatter incident light (such as, for example, through a textured surface), the light may have more opportunities to be absorbed by the cell 300 and limit the escape loss than compared to situations where the light is reflected in a substantially more mirror-like fashion.

Figure 5:
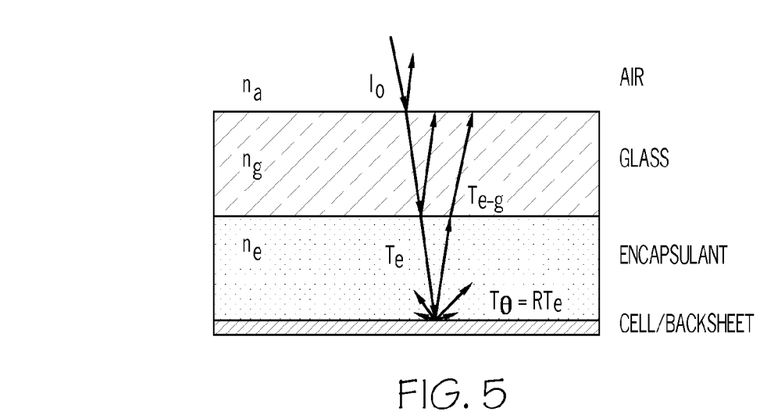
FIG. 5 is a cross-sectional diagram of the reflections of incoming light at the interfaces of different layers in an exemplary photovoltaic module.
Figure 6:
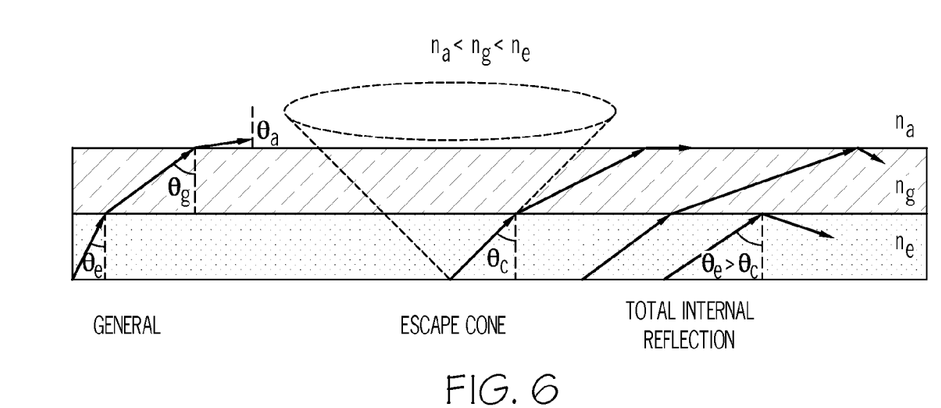
FIG. 6 is a cross-sectional diagram depicting escape cone losses and the refraction of transmitted light resulting in total internal reflection.

As shown in FIGS. 5 and 6, incident light experiences multiple optical losses related to specular reflections at glass-air and glass-encapsulant interfaces. Further, there are also optical losses after reflection from the cell or backsheet and absorption by the various media making up the modules. The amount of specular reflection is determined through Fresnel's equations and is a function of the refractive index of the two media, and is also influenced by absorption. For normal incidence, assuming zero absorption losses, the amount of light which reaches the encapsulant is given by $$T_e = 1 - \frac{(n_g - n_{air})^2}{(n_g + n_{air})^2} - \left(1 - \frac{(n_g - n_{air})^2}{(n_g + n_{air})^2}\right)\frac{(n_e - n_g)^2}{(n_e + n_g)^2} \quad (1)$$

The amount of light which reaches the cell is determined by the refractive index of air ($n_a$), the particular superstrate such as glass ($n_g$), and the encapsulant ($n_e$). In the event that the cell/backsheet produces diffuse reflection, some of the light will become internally reflected. The amount of internally reflected light is determined by the escape cone (see FIG. 6). The amount of diffusely scattered light that escapes the module is known as the escape fraction ($f_{ex}$). By assuming that reflection is independent of incident angle and that the reflection from the cell/backsheet is lambertian, $f_{ex}$ is given as:

$$f_{ex} = \frac{2\pi \int_0^{\theta_c} \cos\theta \sin\theta d\theta}{2\pi \int_0^{\frac{\pi}{2}} \cos\theta \sin\theta d\theta} = \frac{1 - \cos 2\theta_c}{2} \quad (1)$$

where $\theta_c$ is the critical angle of reflection from the backsheet for total internal reflection. The escape cone is defined as $2\theta_c$. At the encapsulant-cell/backsheet interface $T_e$ is reflected diffusely with some intensity $$T_\theta = R_\theta \cdot T_e \quad (2)$$

where $R_\theta$ is the fraction of $T_e$ reflected. The fraction of incident light which is internally reflected is given by $$f_{inc} = R_\theta T_e (1 - f_{ex}) \quad (3)$$

As $R_\theta$ increases, the benefit of a decreased loss cone increases. $R_\theta$ is dictated by the optical properties of the encapsulant and the cell/backsheet.

Based in part on the overall amount of incident photons reaching the cell 300, a photovoltaic module may posses an overall efficiency that may be determined, for example, by measuring the short-circuit current density ($J_{sc}$). The short circuit current density may be measured through modeling or simulation methods that analyze the potential paths of incident photons to predict the short-circuit current density produced. The modeling may be accomplished, for example, through ray-trace simulation as discussed above.

In one embodiment, the modeling (such as, for example, ray-trace simulation) may be employed to measure the short-circuit current density of photovoltaic modules comprising various structures, materials and optical properties to increase overall efficiency. For example, the optical properties (namely the refractive indices and absorption coefficients) for the superstrate 500 and the encapsulant 200, 400 components may vary greatly. However, it may be beneficial to tune these optical properties with respect to one another in order to maximize the predicted short-circuit current density. By modeling the short-circuit current density of various photovoltaic modules 1000 having components of different optical properties, one may tune the selection of materials in order to increase or maximize the efficiency of the photovoltaic module 1000.

The optical properties of the components of the photovoltaic module may vary based on selection or manipulation of the material. In one embodiment, it may be desirable to select a superstrate material such as glass and an encapsulant material that provide a small (i.e., <0.05) mismatch between their refractive indices to reduce the amount of reflection at the glass-encapsulant interface. For example, a selected glass superstrate material may comprise a refractive index of 1.5 at a wavelength of 633 nm. The encapsulant may comprise a silicone material having a refractive index within a specific range of that refractive index such as within ±0.05 of that refractive index.

In another embodiment, the refractive index of the encapsulant material is selected to be greater than the refractive index of the superstrate material to reduce escape cone losses as described above. Because escape cone losses will decrease as the refractive index mismatch of the encapsulant and superstrate increase, encapsulant materials having relatively higher refractive indices can serve to improve module efficiencies.

In certain embodiments, the encapsulant comprises a silicone material having a refractive index that varies based on its chemical composition. Generally, the silicone useful in the practice of embodiments of the present invention comprise alkyl and/or aryl-substituted polysiloxanes. For example, in one embodiment, the silicone material may comprise polydimethylsiloxane (PDMS) having a refractive index of about 1.4 at a wavelength of 633 nm. In another embodiment, the methyl groups of PDMS may be replaced with phenyl groups to form polymethylphenylsiloxane (PMPS) having a refractive index of about 1.53 at a wavelength of 633 nm. In another embodiment, the silicone may comprise polydiphenylsiloxane. In yet another embodiment, the silicone material may comprise a copolymer of PDMS and PMPS with optical properties depending on the relative amounts of methyl and phenyl groups in the overall composition. The relative advantage of one encapsulant material to another may also depend on the cut-off wavelength of the superstrate. For example, a high transmission through the encapsulant generates no benefits if the light has already been absorbed by an overlying material. Thus, where the cut-off wavelength of the superstrate, such as glass, depends strongly on its cerium and iron contents, such contents may influence the relative advantage a certain encapsulant material may actually have.

Alternatively, the refractive index and absorption coefficient of the encapsulant or other components may be adjusted by adding trace amounts of chemicals or compounds such as nanoparticles. For example, crystalline $TiO_2$ nanoparticles may be added to the encapsulant to increase the refractive index of the encapsulant or other materials present in the photovoltaic module 1000. Additional ways of tuning optical properties may comprise lowering the refractive index of the glass (for example by altering the chemical composition of the glass), lowering the refractive index of the cell, or reducing the absorption coefficients of the encapsulant, glass or any anti-reflective coatings present in the photovoltaic module 1000.

Furthermore, the optical properties may be tuned for a specific wavelength range based on the intended application of the photovoltaic module. For example, since both the refractive index and the absorption coefficient depend on wavelength, both properties may vary at different wavelengths. Thus, the relationship of optical properties of different materials will vary and depend on the range of wavelengths used for comparison. One may therefore incorporate the intended purpose of the photovoltaic module, or determine the applicable range of wavelengths in which the cell is intended to capture, when tuning the optical properties of various components of the photovoltaic module. Desirably, the optical properties of the selected encapsulant materials will be substantially the same over substantially the entire visible and UV spectrum.

In yet another embodiment, simulations or measurements may be parameterized based on measured, empirical or otherwise obtained data to extend the comparisons of efficiencies to a greater range. For example, the Schott dispersion formula (presented below) may provide for the extended analysis over a greater wavelength range such as, for example, 300 nm to 1600 nm following the methodology described in H. Bach and N. Nueroth (Eds.), *The Properties of Optical Glass*, 2nd edition, Springer, Berlin, P. 25, 1995.

$$n(\lambda) = a + b\lambda^2 + c\lambda^{-2} + d\lambda^{-4} + \ldots$$

Employing the Schott formula may further provide an assessment of accuracy ($X^2$) based on at least the first three terms (a, band c) of the formula to ensure a proper correlation is reached along the greater range of wavelengths.

Embodiments will be better understood by reference to the following examples which are offered by way of illustration and which one of skill in the art will recognize are not meant to be limiting.

EXAMPLE

Four different encapsulants were applied to three different cell structures to create 12 total samples for modeling. The optical properties of the samples were compared with their overall simulated efficiencies to determine which materials matched up best with one another. By simulating the efficiency of various modules, the optical properties and material selections could be tuned to increase the performance of the photovoltaic module.

The optical properties were first tested for five different materials which may be used as the superstrate or encapsulant components. The superstrate material comprised low-iron Starphire® glass from PPG which possessed a cut-off wavelength of 330 nm. The potential encapsulant materials comprised an ethylene vinyl acetate (EV A) copolymer obtained from STR Solar and three silicones identified as 201, 203 and 205 from Dow Corning Corporation. Silicone 201 was a polydimethylsiloxane having the general formula: $R_1R_1R_3Si-O(R_4Si-O)_n-SiR_1R_1R_3$, where $R_1$ and $R_4$ are methyl groups, $R_3$ is a vinyl group, and n is an integer >25. Silicone 203 was a copolymer of polydimethylsiloxane and polymethylphenylsiloxane having the general formula: $R_1R_1R_3Si-O(R_1R_4Si-O)_n-(R_1R_1Si-O)_m-SiR_1R_1R_3$, where $R_1$ is a methyl group, $R_3$ is a vinyl group, $R_4$ is a phenyl group, and n and m are integers >25. Silicone 205 was a polymethylphenylsiloxane having the general formula: $R_1R_1R_3Si-O(R_4Si-O)_n-SiR_1R_1R_3$, where $R_1$ is a methyl group, $R_4$ is a phenyl group, $R_3$ is a vinyl group, and n is an integer >100.

Referring to FIG. 2, plots of (a) the real refractive index (n) and (b) the absorption coefficient ($\alpha$) for each of the materials are respectively shown as a function of wavelength ($\lambda$). The three silicones maintained a low absorption coefficient over a wide range of wavelengths. All data was experimentally determined by the procedure outlined in K. R. McIntosh, et al., "Increase in external quantum efficiency of encapsulated silicon solar cells from a luminescent down shifting layer," *Progress in Photovoltaics* 17, pp. 191-197, 2009.

Figure 2A:
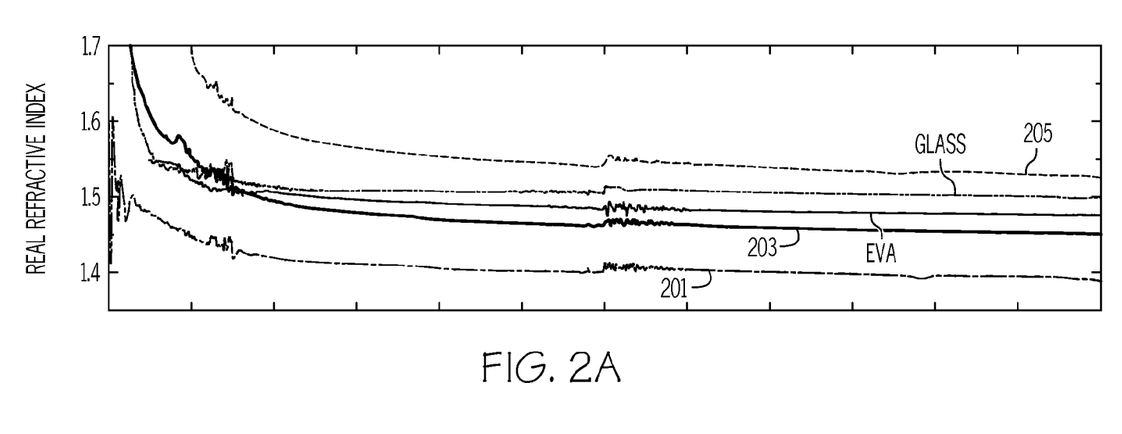
FIG. 2 is a wavelength dependent graph of (a) the real refractive index and (b) the absorption coefficient for a glass and four different encapsulant materials.
Figure 2B:
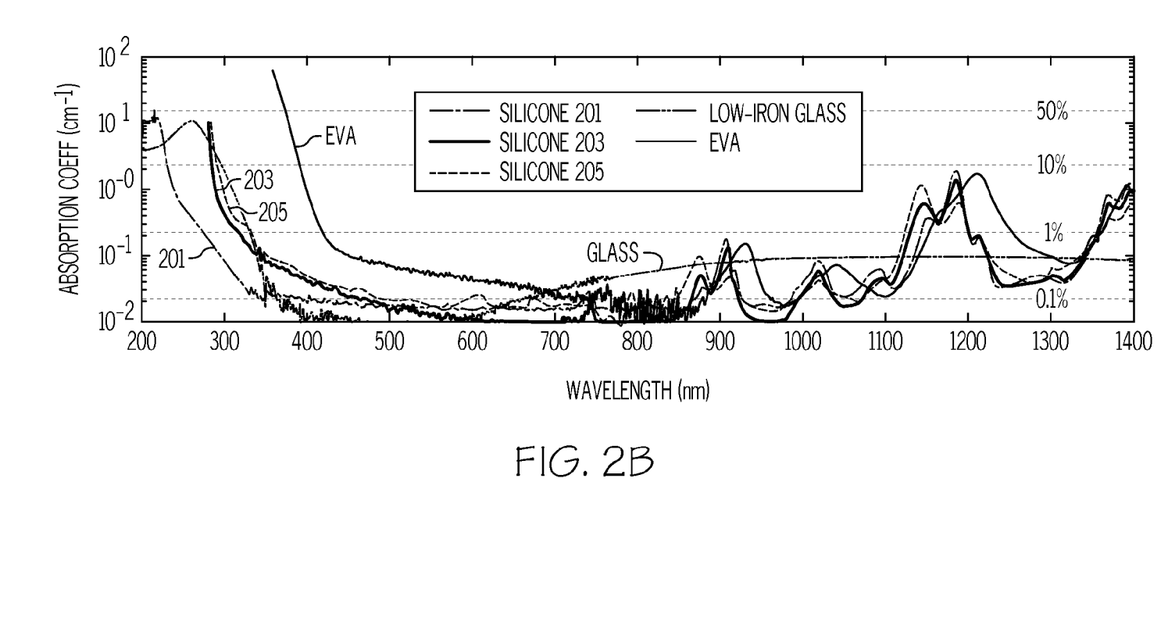

FIG. 2(a) shows that the $n(\lambda)$ of EVA was similar to that of glass, leading to near-ideal optical coupling between the materials. By contrast, the $n(\lambda)$ of silicone 201, which was typical of optical silicones, was notably lower than the $n(\lambda)$ of glass. This would lead to a small reflection at the glass-silicone interface and to more light escaping after diffuse reflection from the cells or backsheet. FIG. 2(a) also indicates higher $n(\lambda)$ achieved by the silicones 203 and 205. FIG. 2(b) indicates that the short-wavelength absorption of EVA extended to 417 nm, compared to 273 nm, 315 nm and 330 nm for silicones 201, 203 and 205, respectively. Thus, the Silicones were found to transmit significantly more short-wavelength photons in the UV portion of the spectrum than EVA. FIG. 2(b) also shows that EVA exhibited similar peaks to the silicones, which occur at 900-940 nm, 1000-1050 nm and 1100-1300 nm, where the magnitudes are the same but where EVA's peaks are broader and centered at a longer wavelength (~20 nm). With 450 μm of encapsulant, the first two peaks absorb between 0.1% and 0.9% of incident photons, while the latter absorbs up to 8%. Finally, FIG. 2(b) shows that $a(\lambda)$ was higher for EVA than for silicone over the wavelength range of 400 nm to 850 nm.

The data could also be parameterized using the Schott formula to provide an alternative comparison opportunity. Table 1 lists the best-fit data and its uncertainty to 95% confidence of a least-squares fit to the first three terms of the Schott dispersion formula:

TABLE 1

Least-squares fit of the Schott dispersion formula to empirical data, where uncertainty represents a 95% confidence interval

| material | a | b (nm$^{-2}$) | c (nm$^2$) | x$^2$ |
|---|---|---|---|---|
| 201 | 1.399 ± 0.0003 | −3.8 ± 0.2 × 10$^{-9}$ | 38.6 ± 0.5 × 10$^2$ | 8 × 10$^{-6}$ |
| 203 | 1.451 ± 0.0003 | −1.1 ± 0.2 × 10$^{-9}$ | 78.6 ± 0.6 × 10$^2$ | 10 × 10$^{-6}$ |
| 205 | 1.524 ± 0.0005 | −0.5 ± 0.3 × 10$^{-9}$ | 116.3 ± 0.9 × 10$^2$ | 30 × 10$^{-6}$ |
| EVA | 1.483 ± 0.0001 | −4.5 ± 0.1 × 10$^{-9}$ | 33.9 ± 0.3 × 10$^2$ | 3 × 10$^{-6}$ |

The optical properties were then simulated for 12 modules fabricated from three types of cells: (A) planar multi-crystalline silicon screen-printed cells, (B) textured mono-crystalline silicon screen-printed cells, and (C) textured mono-crystalline silicon rear-contact cells such as those manufactured by SunPower Corporation as discussed above. The dimensions used for each cell type are found in Table 2.

TABLE 2

Dimensions of cell types A, B and C

| Cell type | | | Cell dimensions | | | |
|---|---|---|---|---|---|---|
| Surface | c-Si | Metal Contact | Square (mm) | Diameter (mm) | Separation (mm) | Packing Factor (%) |
| A planar | multi | screen-printed | 156 | 225 | 2 | 97.50 |
| B textured | mono | screen-printed | 156 | 195 | 2 | 94.70 |
| C textured | mono | rear-contact | 125 | 150 | 2 | 92.10 |

Figure 3:
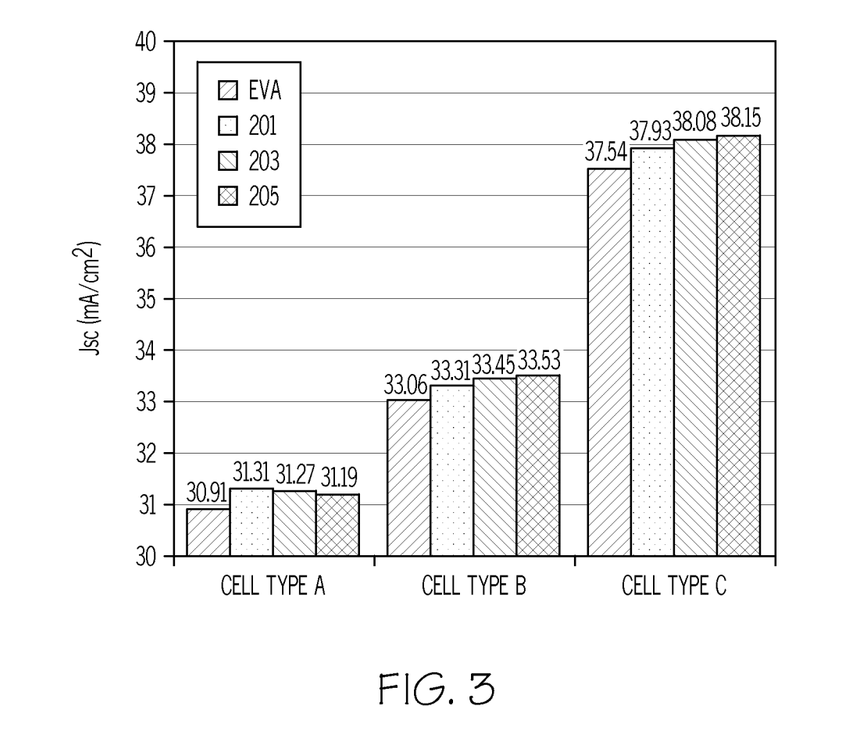
FIG. 3 is a chart of the short-circuit current density ($J_{sc}$) of three different cell types comprising the four different encapsulant materials.

Optical losses for each cell encapsulant material (EVA, 201, 203 and 205) were calculated for each cell type (A, B, and C) in terms short-circuit current density ($J_{sc}$) using ray trace modeling. The optical losses in terms of percentage of short-circuit current density for various loss mechanisms are set forth in Table 3 while the overall short-circuit current density values for each photovoltaic module are found in FIG. 3.

TABLE 3

Optical losses in terms of percentage of $J_{sc}$ where the maximum $J_{sc}$ is:
type A: 38.8 mA/cm²; type B: 39.8 mA/cm²; and type C: 42.9 mA/cm²

| Loss mechanism | Cell Type A | | | | Cell Type B | | | | Cell Type C | | | |
|---|---|---|---|---|---|---|---|---|---|---|---|---|
| | EVA | 201 | 203 | 205 | EVA | 201 | 203 | 205 | EVA | 201 | 203 | 205 |
| Reflection from front | 4.1 | 4.11 | 4.1 | 4.11 | 4.1 | 4.1 | 4.1 | 4.1 | 4.1 | 4.11 | 4.1 | 4.1 |
| Absorption by glass | 1.35 | 1.37 | 1.37 | 1.38 | 1.46 | 1.44 | 1.47 | 1.5 | 1.55 | 1.52 | 1.55 | 1.59 |
| Absorption by encapsulant | 1.71 | 0.13 | 0.11 | 0.14 | 1.58 | 0.14 | 0.12 | 0.15 | 1.81 | 0.15 | 0.13 | 0.17 |
| Absorption by Tedlar/metal | 0.73 | 0.78 | 0.79 | 0.8 | 1.33 | 1.44 | 1.44 | 1.46 | 1.58 | 1.69 | 1.69 | 1.72 |
| Escape loss | 12.35 | 13.01 | 12.98 | 13.2 | 8.5 | 9.17 | 8.83 | 8.61 | 3.51 | 4.22 | 3.79 | 3.47 |

The reflection from the front of the module was about 4.1% for each module and was governed by the refractive index of the glass which was maintained as the same material. The absorption in the glass increased slightly as the cell type changed from A to B to C. Since the modules had the same glass, the difference was attributed to the light's secondary passes through the glass after being reflected from the cell or backsheet (Tedlar®). The difference was greatest in modules having a high reflection from the cells and backsheet, particularly when the reflection was diffusely scattered due to its high fraction of oblique rays.

Absorption in the encapsulant was relatively small (<0.2%) for all modules containing silicone. By contrast, absorption in the EVA was much greater (1.6-1.8%). Like glass, the absorption in the encapsulant was greater when there were more secondary passes of the light. There was a slightly different trend for the encapsulant than for the glass, however, due to its stronger dependence on short-wavelength light, and to cell type A's high reflection at short wavelength.

The wavelength-dependence of the absorption was considered for cell type C since it showed the highest efficiency at all wavelengths and therefore was the most sensitive to absorption. The results are presented in Table 4 below:

TABLE 4

Absorption in glass and encapsulant by wavelength ranges for cell type C (data in mA/cm²)

| | | | | |
|---|---|---|---|---|
| Short-wavelength | <420 | 0.026 | 0.675 | 0.003 |
| Mid-wavelength | 420-880 | 0.3 | 0.069 | 0.03 |
| Smaller peaks | 880-1100 | 0.32 | 0.027 | 0.025 |
| Large peak | >1100 | 0.02 | 0.005 | 0.006 |

* Glass absorption for an EVA-encapsulated module.

The table indicates that at short wavelengths, EVA absorbed strongly, the glass slightly, and silicone 201 almost not at all. At longer wavelengths, the glass absorbed more strongly than the encapsulants due to the broad absorption peak associated with iron (see FIG. 2(b)). For the encapsulants, the small and large absorption peaks absorb similarly, irrespective of whether they were EVA or silicone. Modules with high cell efficiencies at long wavelengths were more affected by these peaks.

Absorption in the backsheet was smaller for cells having less Tedlar® area (A, B then C), while absorption in the metal was greater for cells with more metal (A, B then C). The escape loss was greatest for type A modules for two reasons: (i) being planar, the cells reflected in a specular manner and hence light could not be trapped within the module via total internal reflection (TIR) at the glass-air interface; and (ii) it had the highest reflection from the cell's ARC and metal. The escape loss for type B modules was smaller because the textured cells reflect diffusely leading to some TIR at the glass-air interface. The escape loss for type C modules was smaller still because the cells had no metal on the front.

Table 3 also showed that when the modules had large diffuse areas (namely cell types B and C) the escape loss was smaller for encapsulants of a higher refractive index. This had little to do with reflection from the glass-encapsulant or encapsulant-ARC interfaces, which were both relatively small. Instead, it related to diffuse reflection from the cells and backsheet, and the fraction of that light was internally reflected at the glass-air interface. Assuming a Lambertian reflection, the fraction of light within the escape cone $f_{esc}$ depends only on the refractive index of the encapsulant $n_{enc}$ (and not the glass due to Snell's law) by the equation presented below where $\theta_c$ is the critical angle:

$$f_{esc} = \frac{2\pi \int_0^{\theta_c} \cos\theta\sin\theta d\theta}{2\pi \int_0^{\pi/2} \cos\theta\sin\theta d\theta} = \frac{1-\cos 2\theta_c}{2}$$

Figure 4:
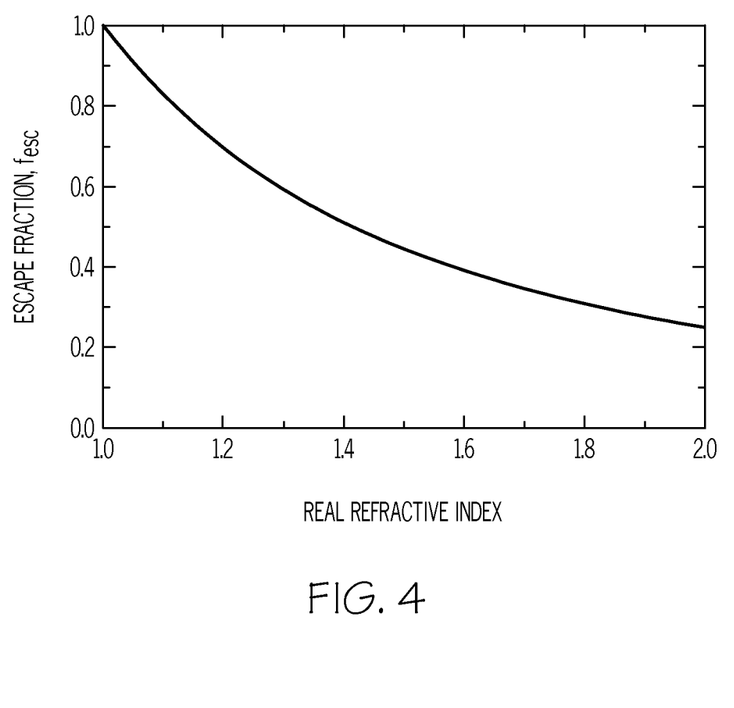
FIG. 4 is a graph of the fraction of light within the escape cone at the glass-air interface as a function of the encapsulants' refractive index for light that reflects from the cell or backsheet.

Referring to FIG. 4, a plot of $f_{esc}$ as a function of $n_{enc}$ is presented. It shows that by increasing $n_{enc}$ from 1.40 to 1.55, $f_{esc}$ decreases from 0.51 to 0.42. This decrease in escape loss results in more TIR and therefore a higher $J_{sc}$, as evidenced by FIG. 3 for the modules with more Lambertian surface (B and C). For type A cell modules, which had planar cells and very little backsheet exposed, there was little advantage to using an encapsulant of higher refractive index. There was, in fact a disadvantage to using silicones 203 or 205 compared to silicone 201 due to them being slightly more absorbing. The abovementioned data and analysis not only allows for the more efficient selection of photovoltaic module materials based on their optical properties, but it also shows additional improvement may be achieved by encapsulants of even higher refractive indices (see for example FIG. 4).

Figure 7:
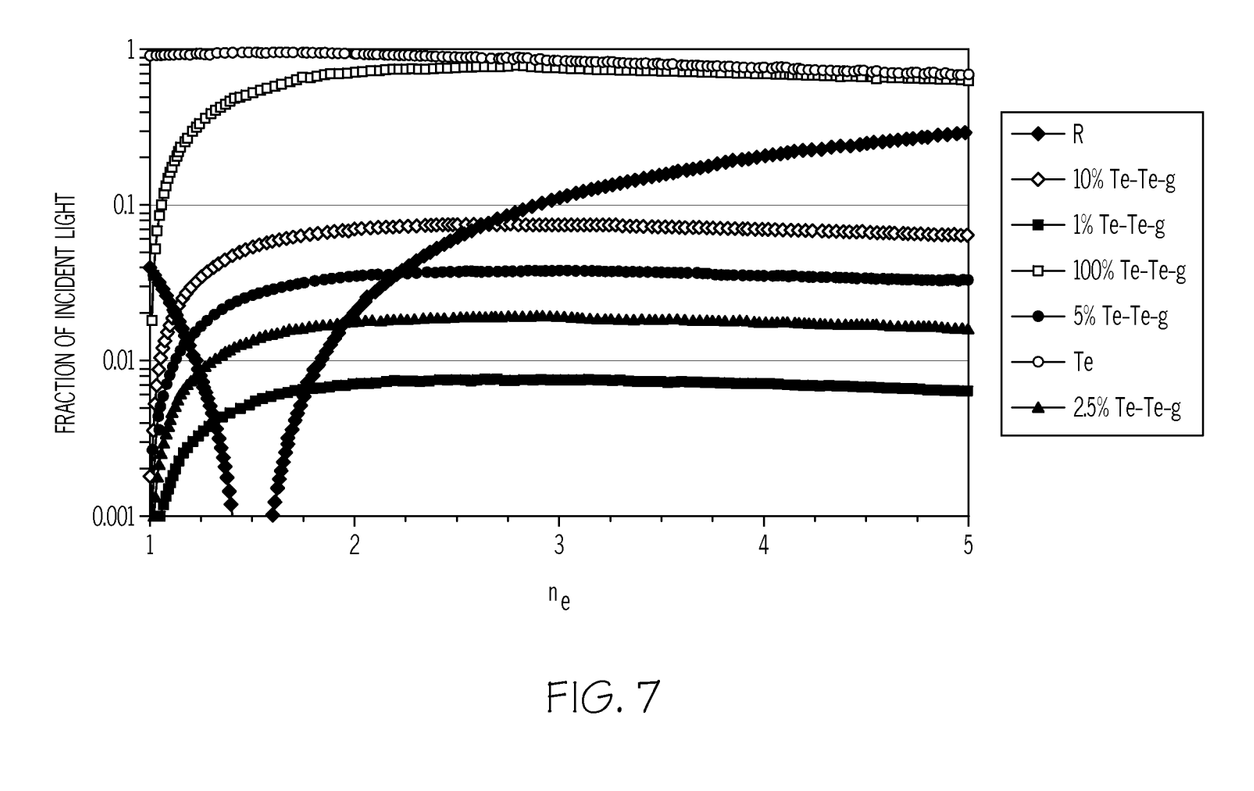
FIG. 7 is a graph depicting the fraction of incident light which is reflected at the superstrate-encapsulant interface (R) or transmitted into the encapsulant ($T_e$)

To demonstrate the effects of encapsulant refractive index on escape cone losses in a photovoltaic cell, the fraction of incident light reflected initially from the glass-encapsulant interface and the fraction of incident light internally reflected after diffuse reflection off the cell/backsheet (assuming lambertian reflection) was calculated as a function of encapsulant refractive index ($n_e$). The calculations assume normal incidence, $n_a$=1, $n_g$=1.5 (at 633 nm). As can be seen from FIG. 7, the cross over point (i.e., the point at which the refractive mismatch at the glass encapsulant interface exceeds the optical gains from using a higher RI encapsulant) changes as the fraction of $T_e$ that is diffusely reflected changes. If the diffusely reflected component is greater than 1% $T_e$ the crossover point where the benefit of the smaller escape cone loss is negated by the reflection at the encapsulant-glass interface is above $n_e$=1.67 as seen in FIG. 7.

Figure 8A:
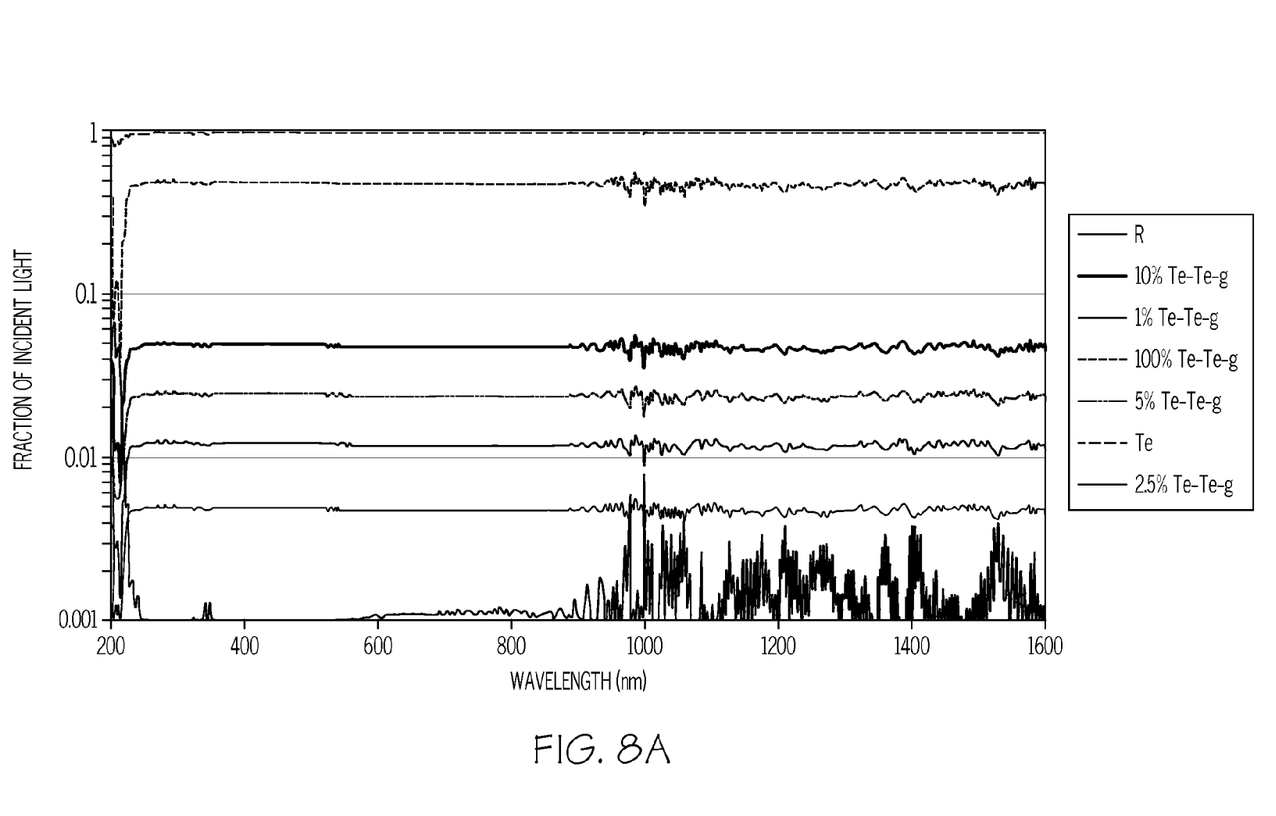
FIGS. 8(a)-8(c) are graphs depicting the fraction of incident light which is reflected at the superstrate-encapsulant interface (R) or transmitted into an exemplary photovoltaic cell ($T_e$) and internally reflected for various values of $R_θ$.
Figure 8B:
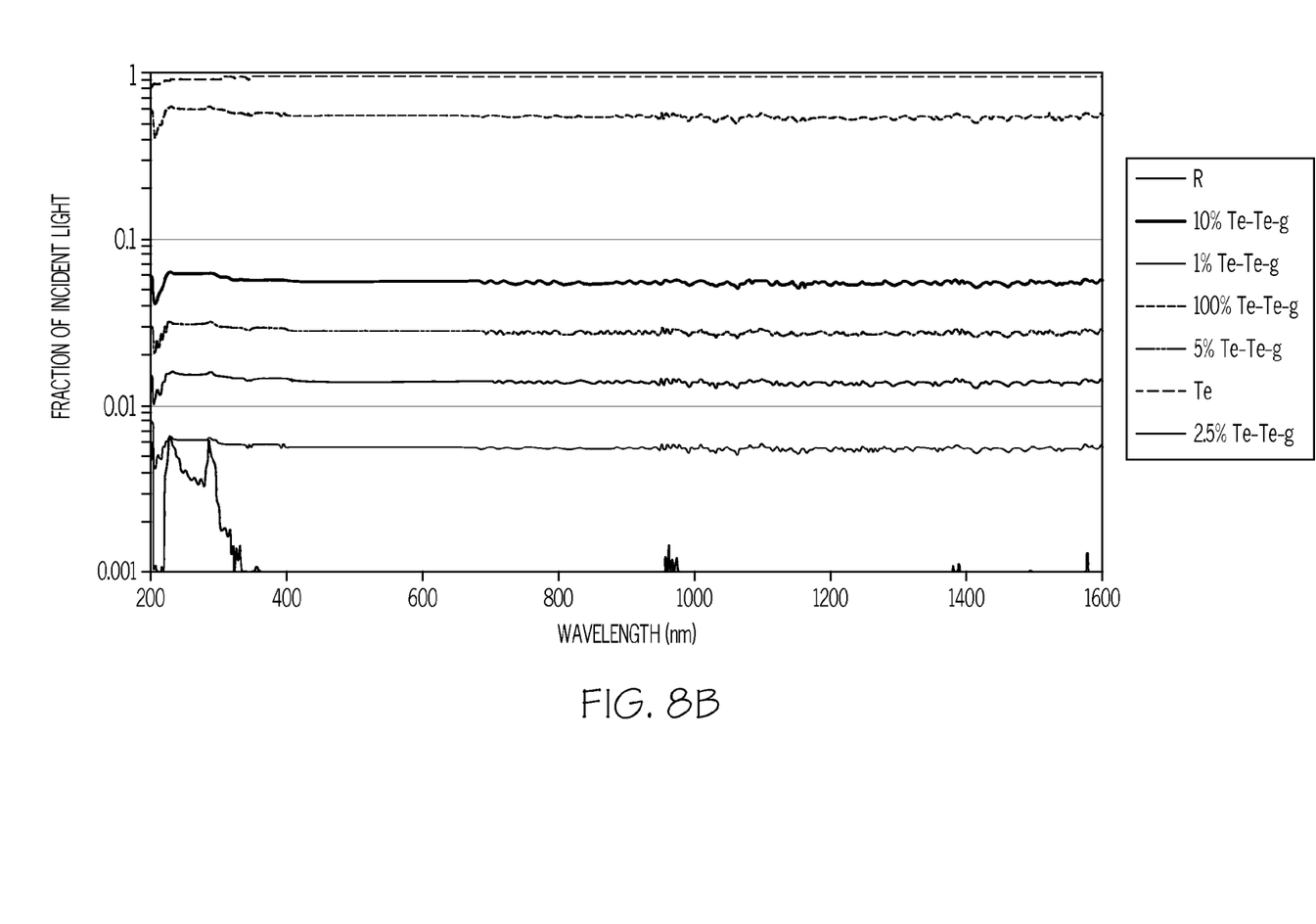
Figure 8C:
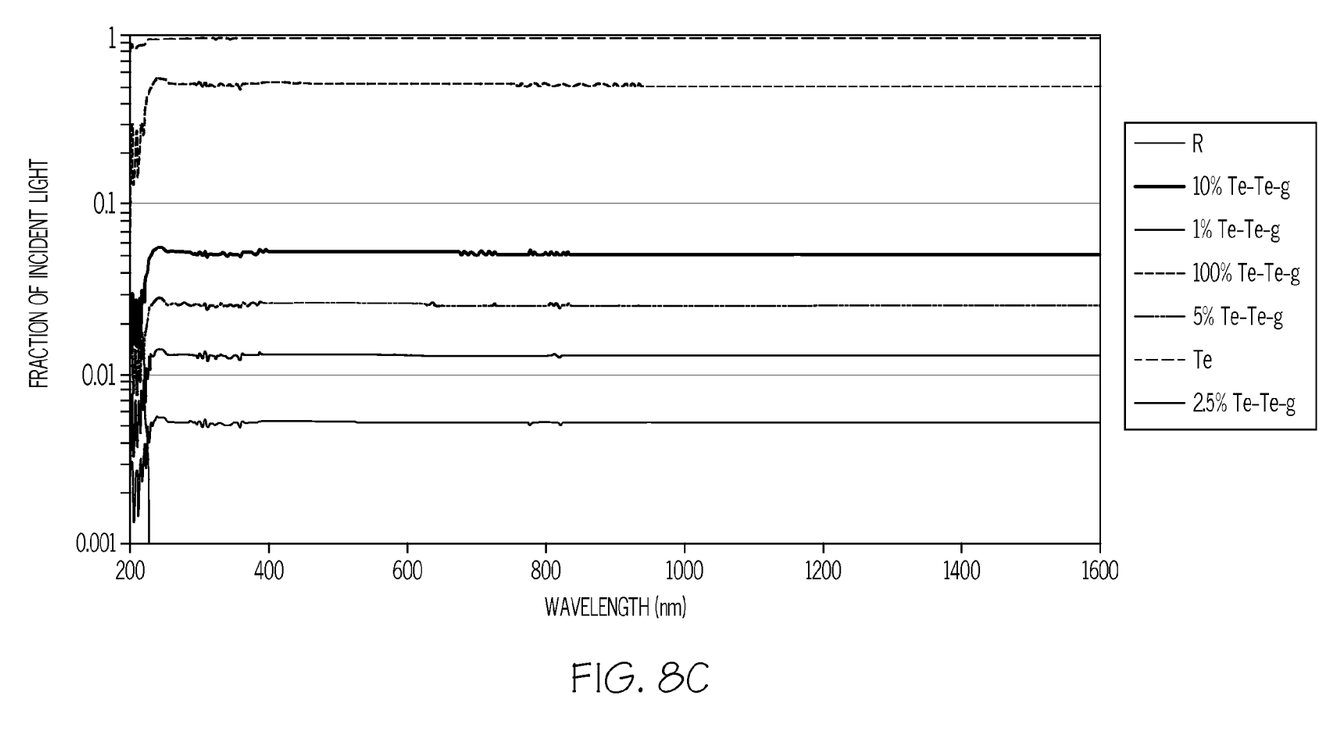
Figure 9A:
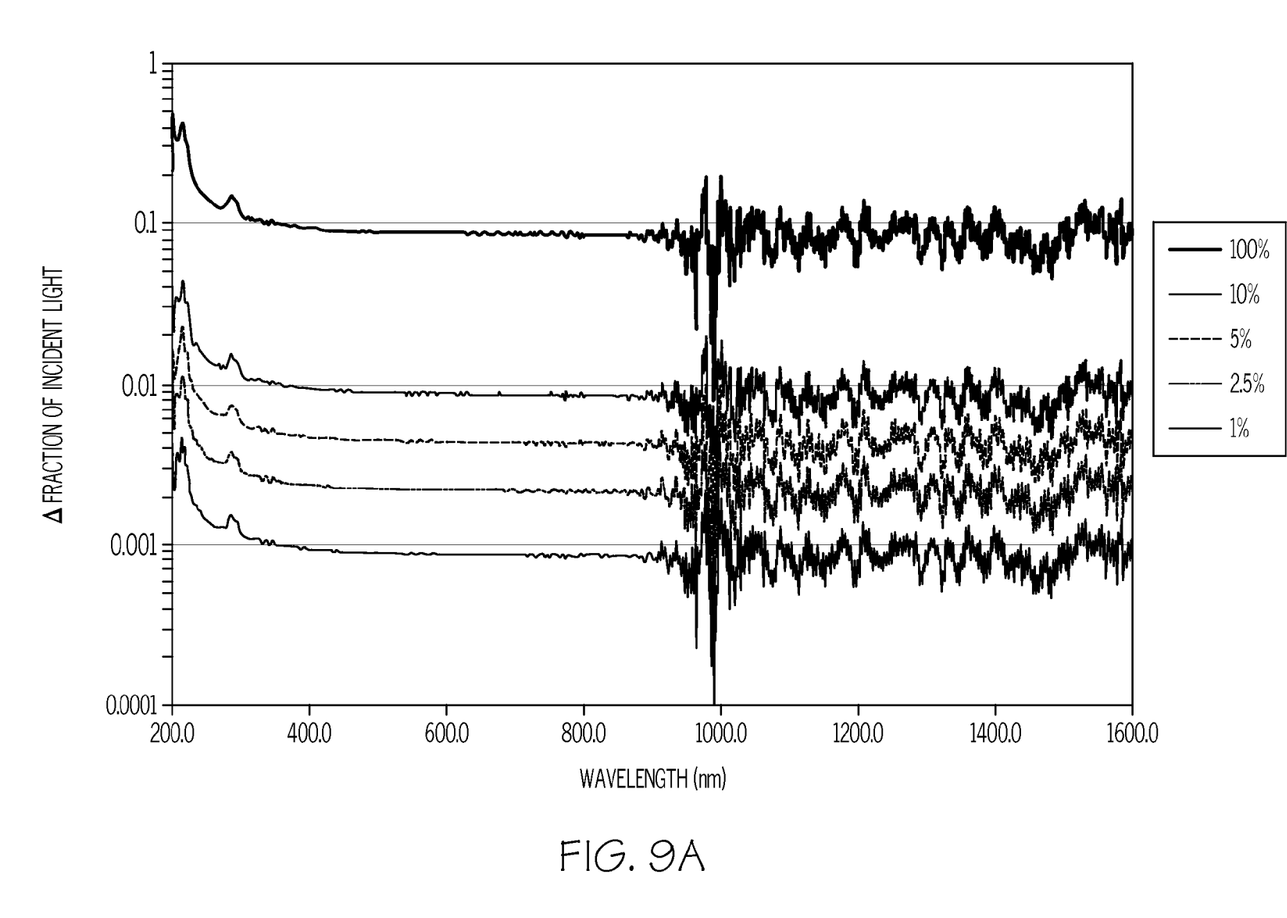
FIGS. 9(a) and 9(b) are graphs depicting the difference in internal reflection through cone loss tuning between different encapsulants.
Figure 9B:
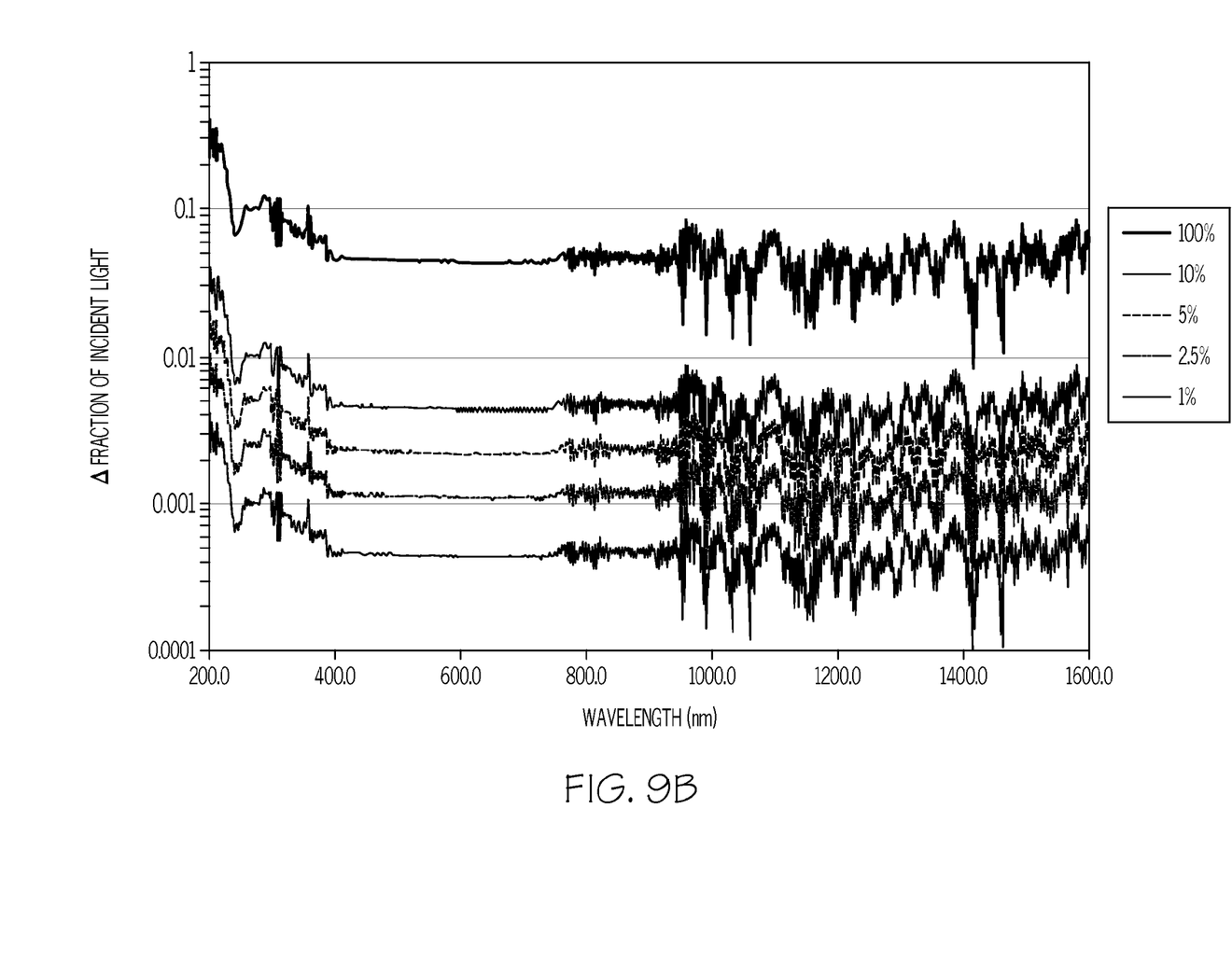

Using measured values of refractive index for Starphire® glass, silicone 201 and silicone 205, the fraction of incident light internally reflected as a function of wavelength was calculated (see FIGS. 8(a)-8(c)). The difference between the silicones 205 and 201, as well as silicone 205 and an EVA copolymer is shown in FIGS. 9(a) and (b). The calculations demonstrate that the higher $n_e$ value of silicone 205 does show a benefit of 0.01-10% depending on the amount of $T_e$ diffusely reflected by the cell/backsheet. Note that the values for silicone 201 may be overestimated due to internal reflections in the glass that arise when $n_e < n_g$.

The present invention should not be considered limited to the specific examples described herein, but rather should be understood to cover all aspects of the invention. Various modifications and equivalent processes, as well as numerous structures and devices, to which the present invention may be applicable will be readily apparent to those of skill in the art. Those skilled in the art will understand that various changes may be made without departing from the scope of the invention, which is not to be considered limited to what is described in the specification.

What is claimed is:

1. A method for fabricating a photovoltaic module having a gain in efficiency, the method comprising:
    selecting a photovoltaic cell operable to convert photons to electrons;
    selecting a light transparent superstrate having a superstrate absorption coefficient and a superstrate refractive index;
    selecting an encapsulant having an encapsulant absorption coefficient and an encapsulant refractive index, wherein the absorption coefficients of the superstrate and the encapsulant are selected to optimize light reaching the photovoltaic cell, and wherein the encapsulant refractive index is greater than the superstrate refractive index such that there is a gain in efficiency; and
    assembling the photovoltaic module using the selected materials, such that the encapsulant surrounds the photovoltaic cell and separates the superstrate from the photovoltaic cell;
    wherein the gain in efficiency is further based on tuning the absorption coefficients and refractive indices of the superstrate and encapsulant in order to maximize the short-circuit current density of the photovoltaic cell.

2. The method of claim 1 wherein the optimized gain in efficiency is based in part on escape cone loss.

3. The method of claim 1 wherein the encapsulant comprises silicone.

4. The method of claim 3 wherein said silicone comprises a homopolymer or copolymer of alkyl and/or aryl-substituted polydimethylsiloxanes.

5. The method of claim 3 wherein said silicone comprises a copolymer of polydimethylsiloxane and polymethylphenylsiloxane.

6. The method of claim 5 wherein the superstrate refractive index is about 1.5.

* * * * *